(12) United States Patent
Fuergut et al.

(10) Patent No.: US 8,778,733 B2
(45) Date of Patent: Jul. 15, 2014

(54) SEMICONDUCTOR PACKAGE AND METHODS OF FORMATION THEREOF

(75) Inventors: Edward Fuergut, Dasing (DE); Joachim Mahler, Regensburg (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 29 days.

(21) Appl. No.: 13/423,951

(22) Filed: Mar. 19, 2012

(65) Prior Publication Data

US 2013/0241077 A1   Sep. 19, 2013

(51) Int. Cl.
*H01L 21/00* (2006.01)

(52) U.S. Cl.
USPC .................. 438/107; 438/127; 257/E21.499; 257/E21.502

(58) Field of Classification Search
USPC .................. 257/E23.123, E23.127, E25.015, 257/E25.016; 438/459
See application file for complete search history.

(56) References Cited

U.S. PATENT DOCUMENTS

| | | | |
|---|---|---|---|
| 5,814,889 A | 9/1998 | Gaul | |
| 7,993,941 B2 | 8/2011 | Huang et al. | |
| 2005/0046022 A1 | 3/2005 | Alter | |
| 2008/0316714 A1* | 12/2008 | Eichelberger et al. | 361/728 |
| 2009/0286357 A1 | 11/2009 | Beer | |
| 2010/0062563 A1 | 3/2010 | Pressel et al. | |
| 2010/0133682 A1* | 6/2010 | Meyer | 257/698 |
| 2010/0144101 A1 | 6/2010 | Chow et al. | |
| 2010/0193928 A1 | 8/2010 | Zudock et al. | |
| 2011/0012258 A1 | 1/2011 | Omandam et al. | |
| 2011/0215449 A1 | 9/2011 | Camacho et al. | |
| 2012/0049344 A1* | 3/2012 | Pagaila et al. | 257/737 |
| 2012/0068231 A1* | 3/2012 | Garnett | 257/263 |

OTHER PUBLICATIONS

Wojnowski, M., et al., "Package Trends for Today's and Future mm-Wave Applications," The 38$^{th}$ European Microwave Conference, 2008, 55 pages.

* cited by examiner

*Primary Examiner* — W. Wendy Kuo
*Assistant Examiner* — Shaka White
(74) *Attorney, Agent, or Firm* — Slater & Matsil, L.L.P.

(57) ABSTRACT

In one embodiment, a method of forming a semiconductor package includes placing a first die and a second die over a carrier. At least one of the first and the second dies are covered with an encapsulation material to form an encapsulant having a top surface and an opposite bottom surface. The encapsulant is thinned from the bottom surface to expose a first surface of the first die without exposing the second die. The exposed first surface of the first die is selectively etched to expose a second surface of the first die. A back side conductive layer is formed so as to contact the first surface. The second die is separated from the back side conductive layer by a first portion of the encapsulant.

35 Claims, 16 Drawing Sheets

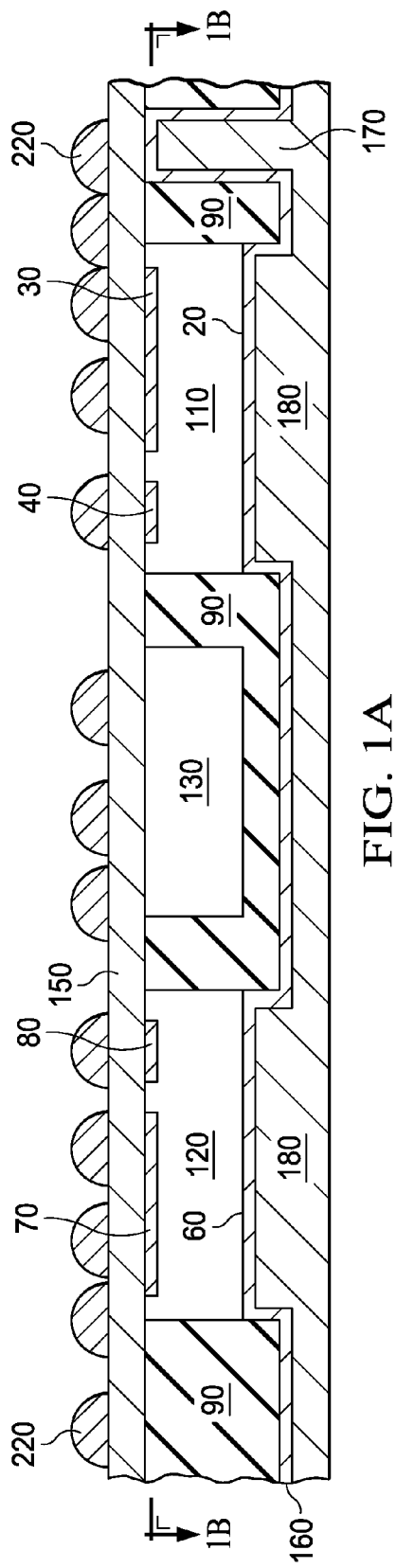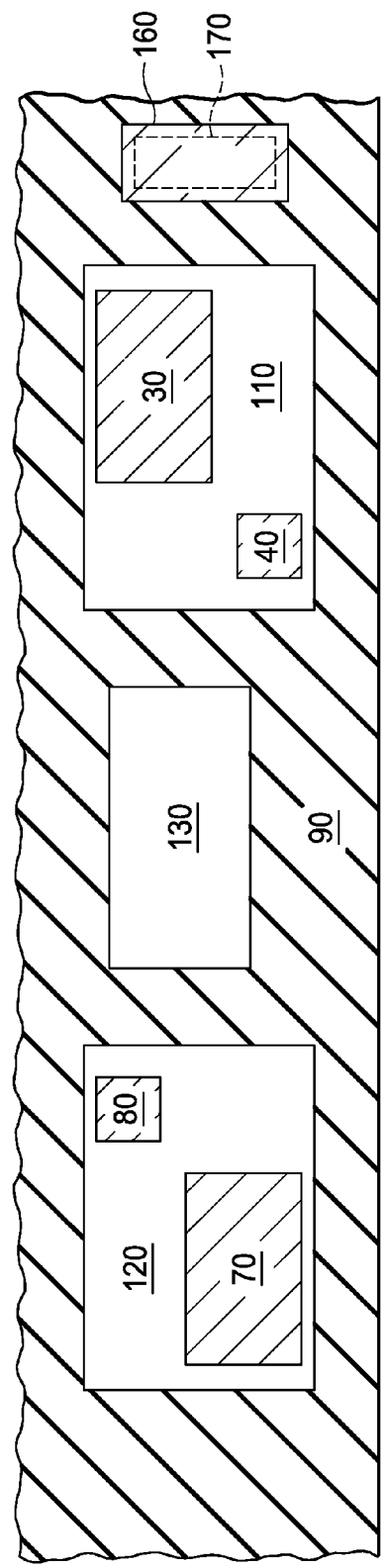
FIG. 1A
FIG. 1B

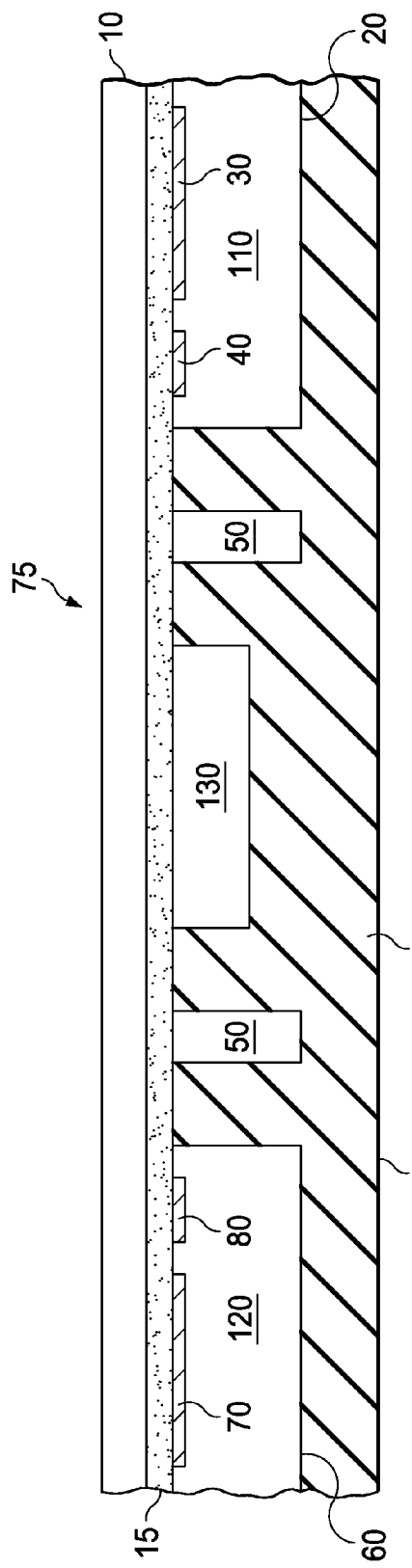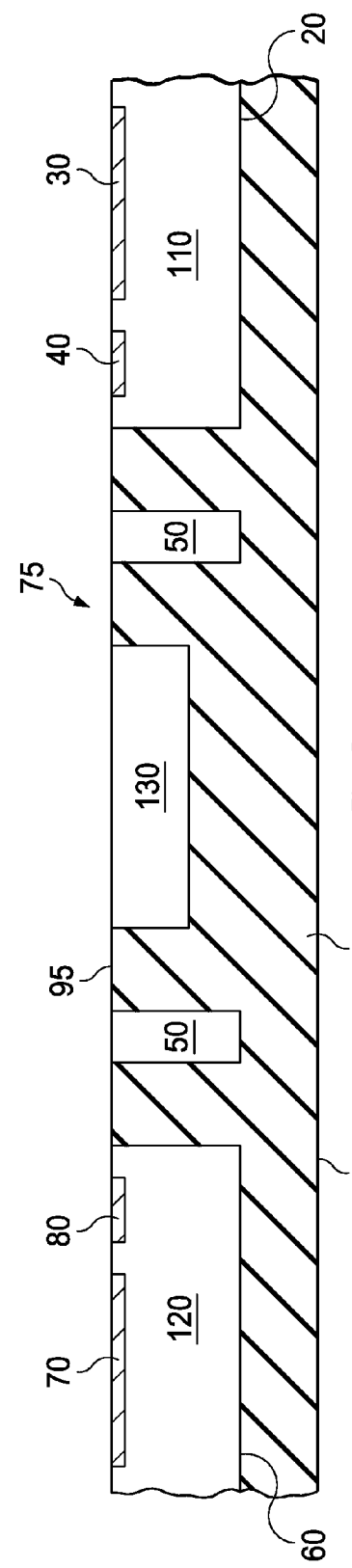

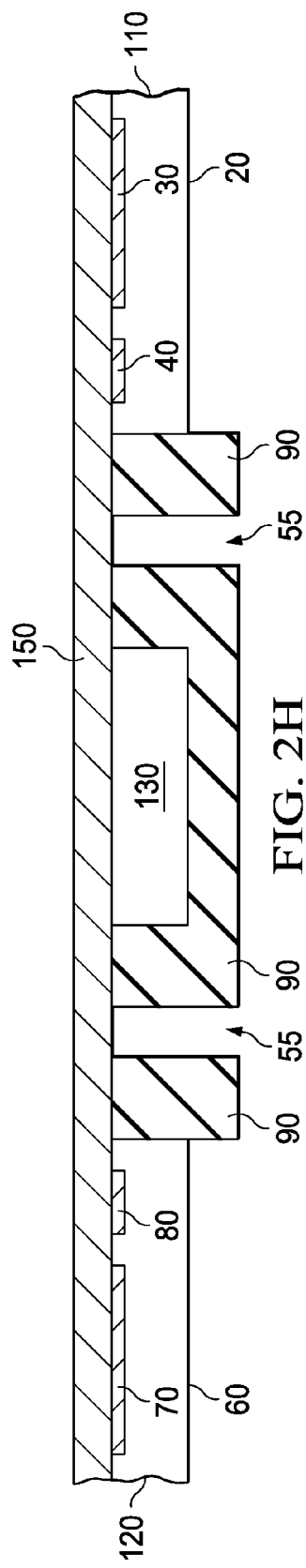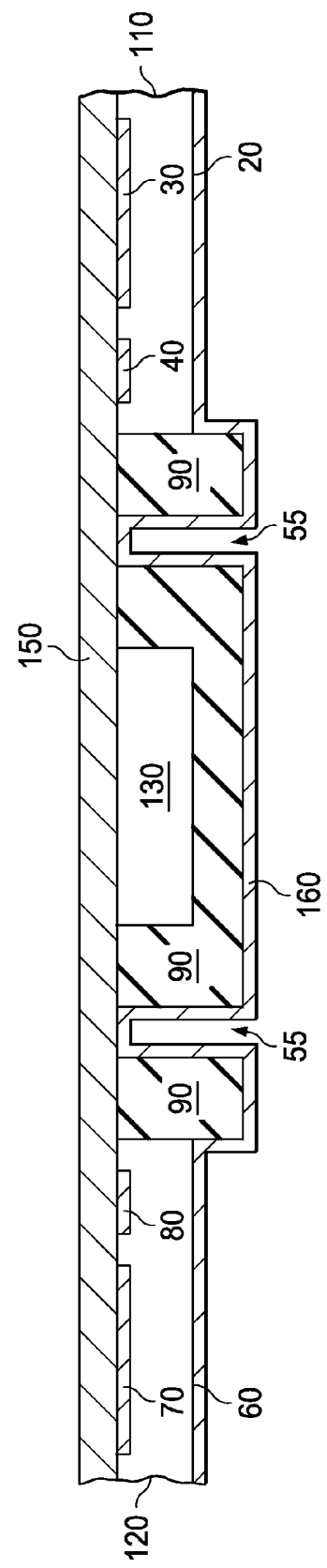

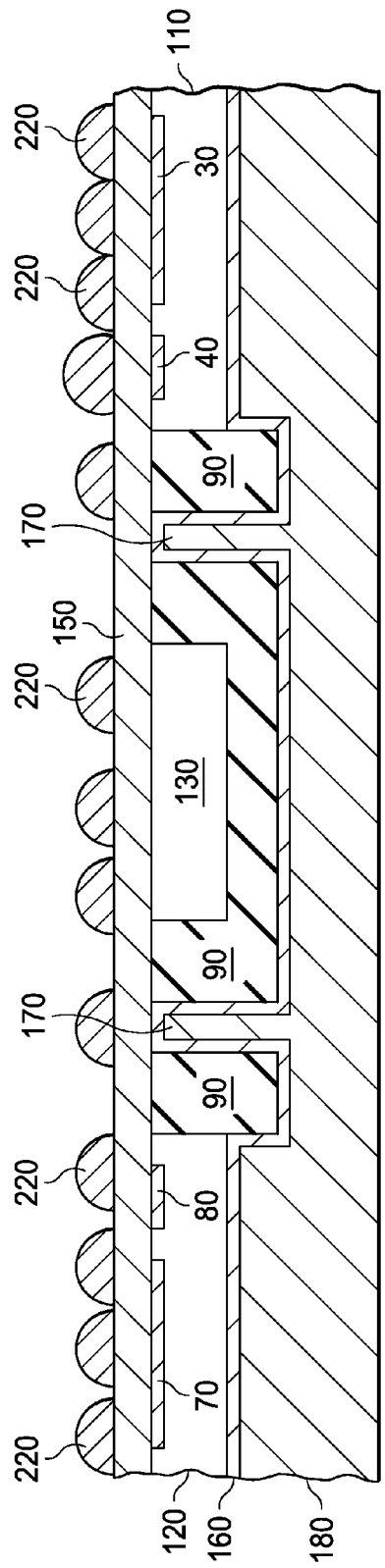
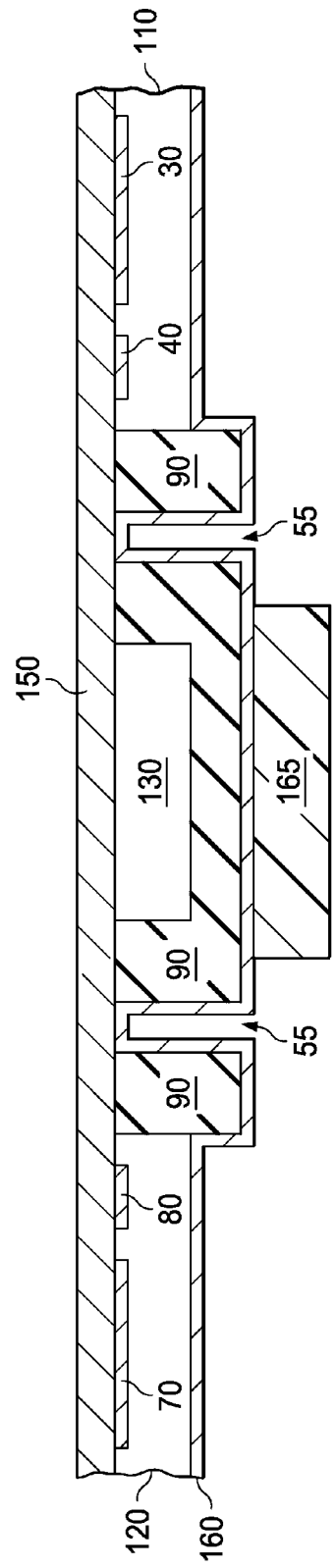
FIG. 3E
FIG. 4A

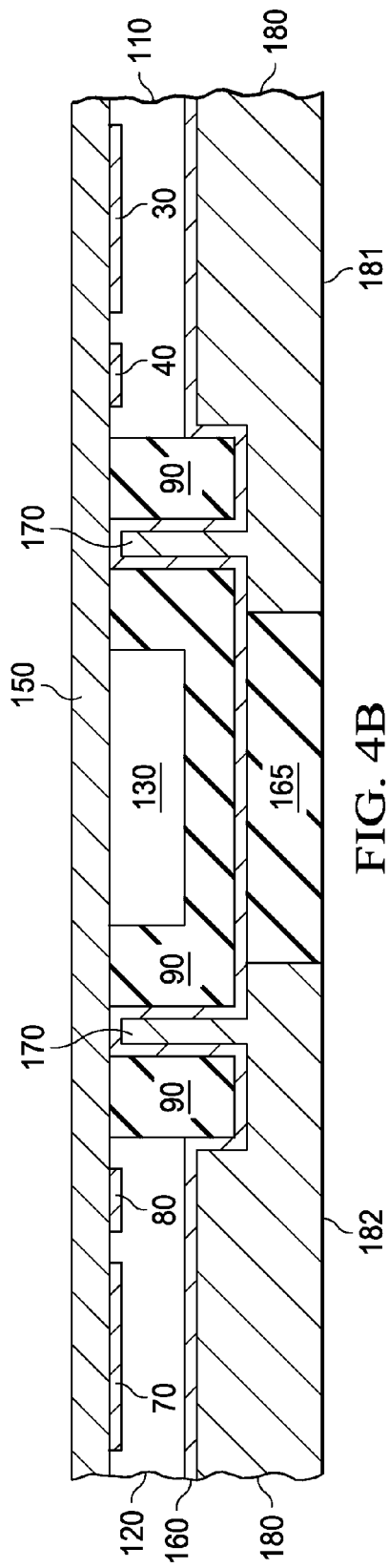
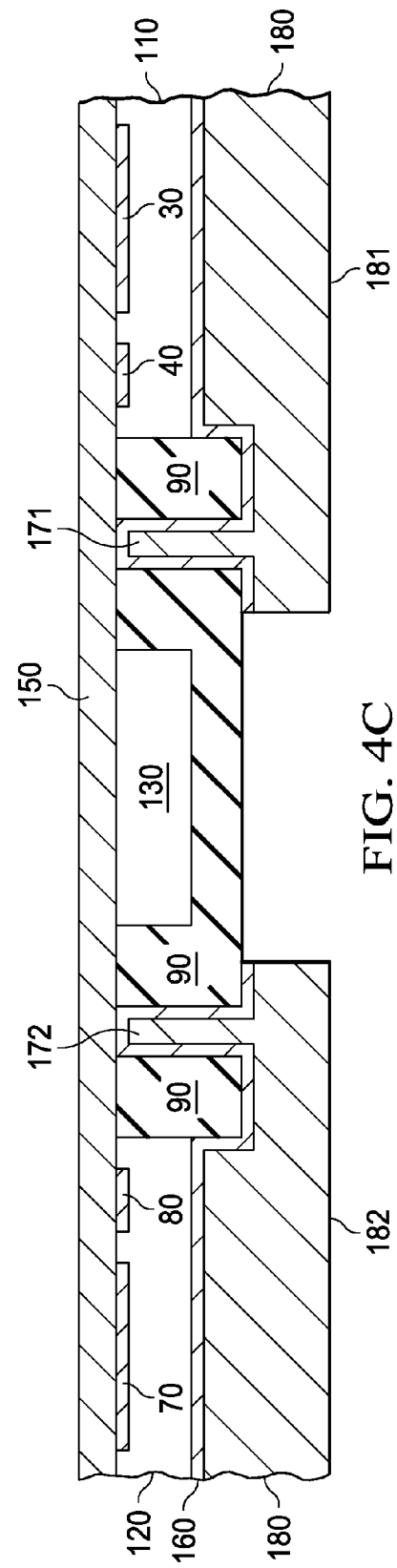
FIG. 4B
FIG. 4C

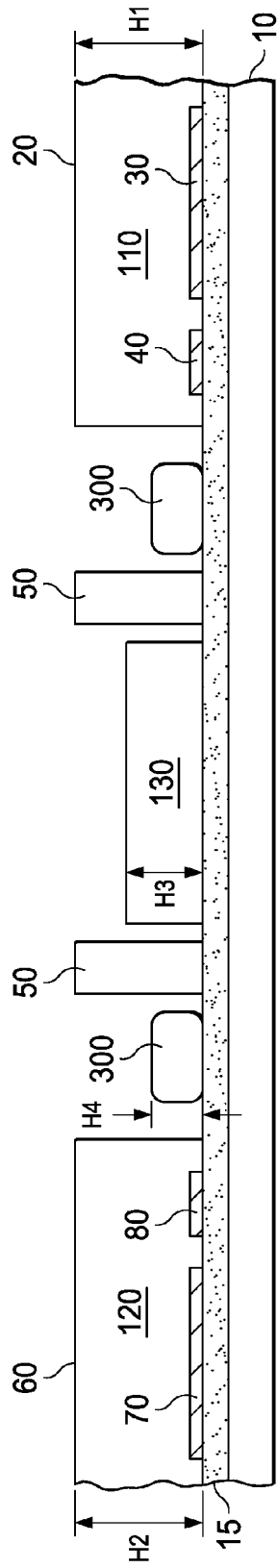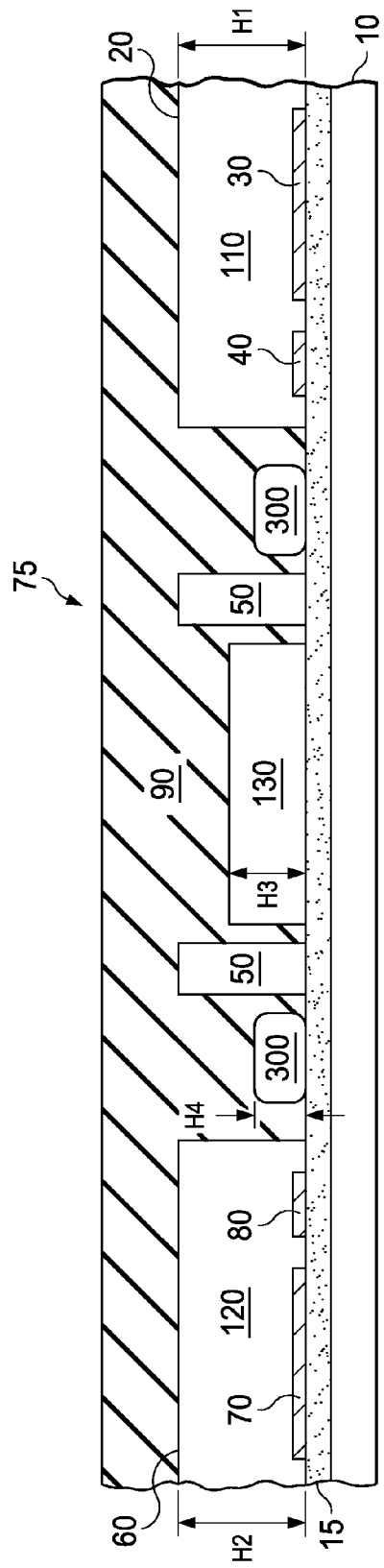

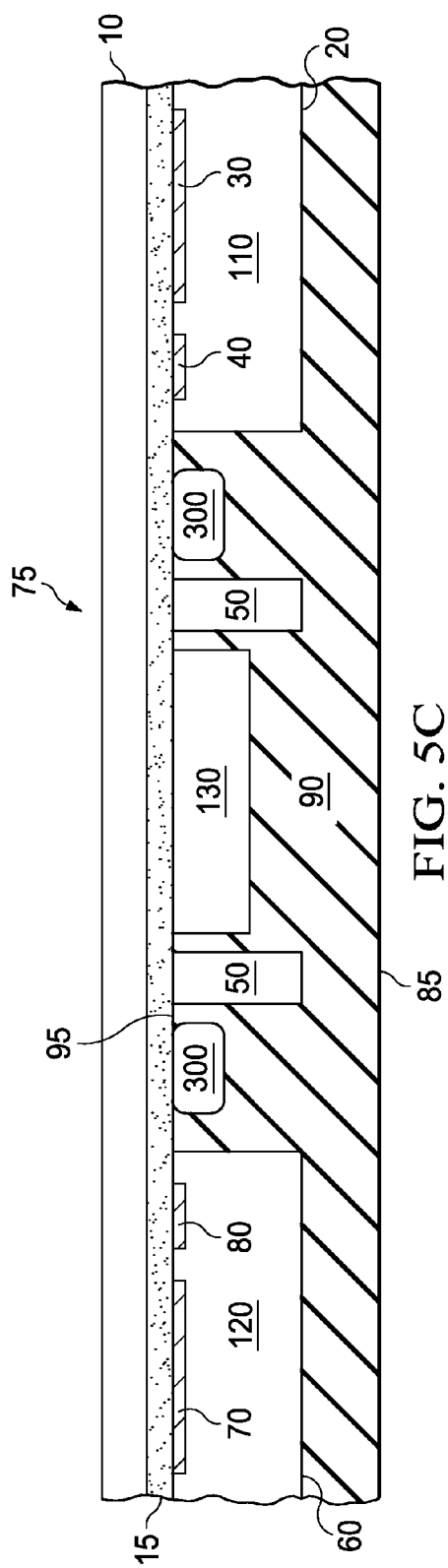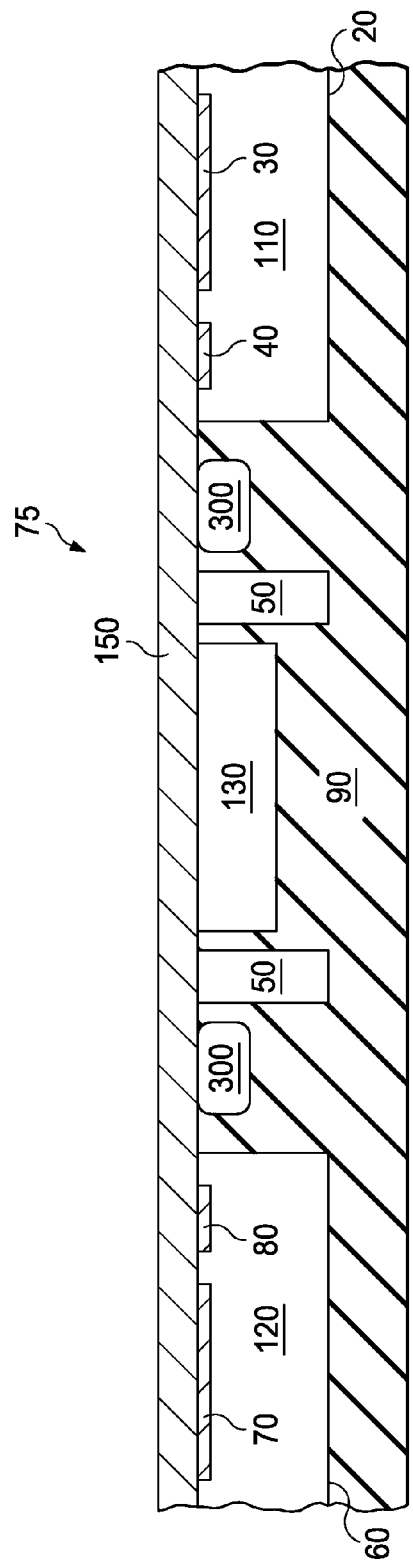

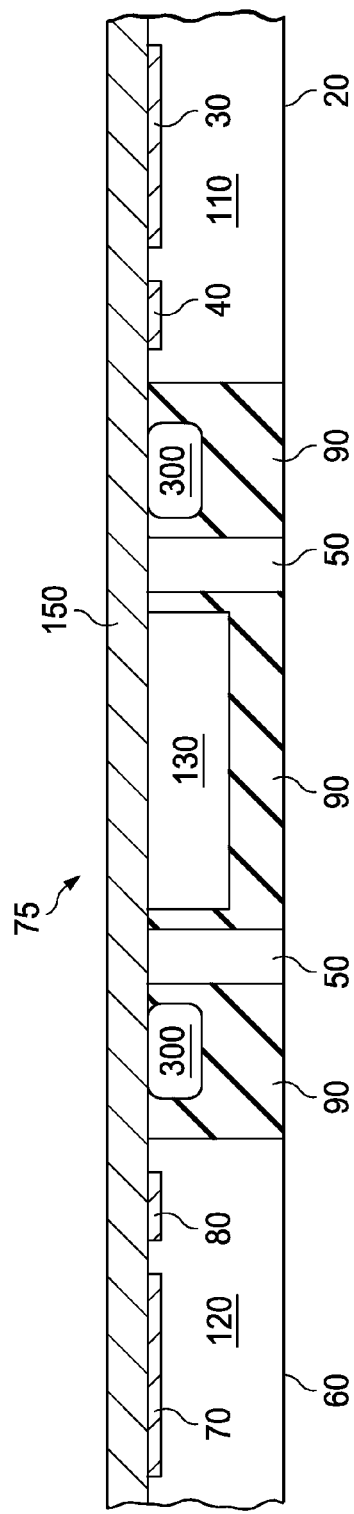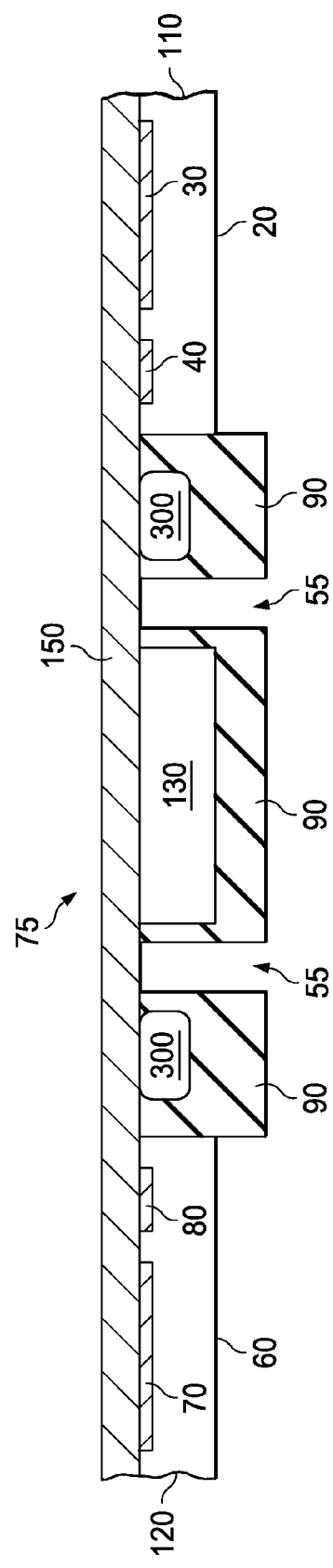

SEMICONDUCTOR PACKAGE AND METHODS OF FORMATION THEREOF

TECHNICAL FIELD

The present invention relates generally to semiconductor packages, and more particularly to semiconductor packages and method of forming them.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Semiconductor devices are packaged using various packaging technologies. One way of packaging semiconductor devices is wafer level packaging, which refers to a particular packaging technology where an integrated circuit is packaged at the wafer level. In wafer level packaging, an integrated circuit is packaged at wafer level, instead of the traditional process of assembling the package of each individual unit after wafer dicing. The chips are packaged directly on the wafer and dicing of the wafer takes place after the chips are packaged. Wafer level packaging may be used to manufacture chip scale packages.

A package formed using such wafer level packaging, i.e., a wafer level package (WLP) is a promising solution for high-speed packaging needs. Because the length of the interconnection lines on the WLP is limited to die size, the WLP has a minimum number of electrical parasitic elements.

Wafer level packaging is a true chip-scale packaging technology, as the resulting package is about the same size as the die. By extending the wafer fab processes to include device interconnection and device protection processes, wafer-level packaging integrates wafer fab processes with packaging and possibly test and burn-in at wafer level, streamlining and reducing manufacturing costs.

Embedded wafer level packaging is an enhancement of the standard wafer level packaging in which the packaging is realized on an artificial wafer. A standard wafer is diced and the singulated chips are placed on a carrier. The distances between the chips on the carrier may be chosen freely. The gaps around the chips may be filled with an encapsulation material to form an artificial wafer. The artificial wafer is processed to manufacture packages comprising the chips and a surrounding fan-out area. Interconnect elements may be realized on the chip and the fan-out area forming an embedded wafer level ball grid array (eWLB) package.

SUMMARY OF THE INVENTION

These and other problems are generally solved or circumvented, and technical advantages are generally achieved, by illustrative embodiments of the present invention.

In one embodiment, a method of forming a semiconductor package includes placing a first die and a second die over a carrier. At least one of the first and the second dies are covered with an encapsulation material to form an encapsulant having a top surface and an opposite bottom surface. The encapsulant is thinned from the bottom surface to expose a first surface of the first die without exposing the second die. The exposed first surface of the first die is selectively etched to expose a second surface of the first die. A back side conductive layer is formed so as to contact the first surface. The second die is separated from the back side conductive layer by a first portion of the encapsulant.

In accordance with an embodiment of the present invention, a method of forming a semiconductor package comprises placing a first die and a second die over a carrier and placing a semiconductor pillar adjacent the first and the second dies over the carrier. The first and the second dies and the semiconductor pillar are covered with an encapsulation material to form an encapsulant having a top surface and an opposite bottom surface. The encapsulant is separated from the carrier to expose the bottom surface. The encapsulant is thinned from the bottom surface to expose a first surface of the first die and a second surface of the semiconductor pillar without exposing the second die. The first die has a greater vertical height than the second die so that the thinning exposes the first surface but not the second die. The semiconductor pillar is removed to form a through opening. A back side conductive layer contacting the first die is formed within the through opening. The second die is separated from the back side conductive layer by a first portion of the encapsulant.

In accordance with an embodiment of the present invention, a semiconductor package comprises a first die having a first backside contact area and disposed in a encapsulant, and a second die disposed in the encapsulant. The first die is isolated from the second die by a first portion of the encapsulant. A conductive layer is disposed under the first die and the second die. The conductive layer contacts the first backside contact area. A second portion of the encapsulant isolates a back surface of the second die from the conductive layer.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a semiconductor package having a plurality of dies in accordance with embodiments of the invention, wherein FIG. 1A illustrates a cross-sectional view and FIG. 1B illustrates a top view;

FIG. 2, which includes FIGS. 2A-2K, illustrates a semiconductor package during various stages of manufacturing in accordance with embodiments of the present invention;

FIG. 3, which includes FIGS. 3A-3E, illustrates an alternative embodiment of forming a semiconductor package having a plurality of different sized dies;

FIG. 4, which includes FIGS. 4A-4C, illustrates an alternative embodiment of forming a semiconductor package having at least two dies of different sizes;

FIG. 5, which includes FIGS. 5A-5H, illustrates a semiconductor package during various stages of formation in accordance with an embodiment of the invention;

FIG. 8, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 2A:
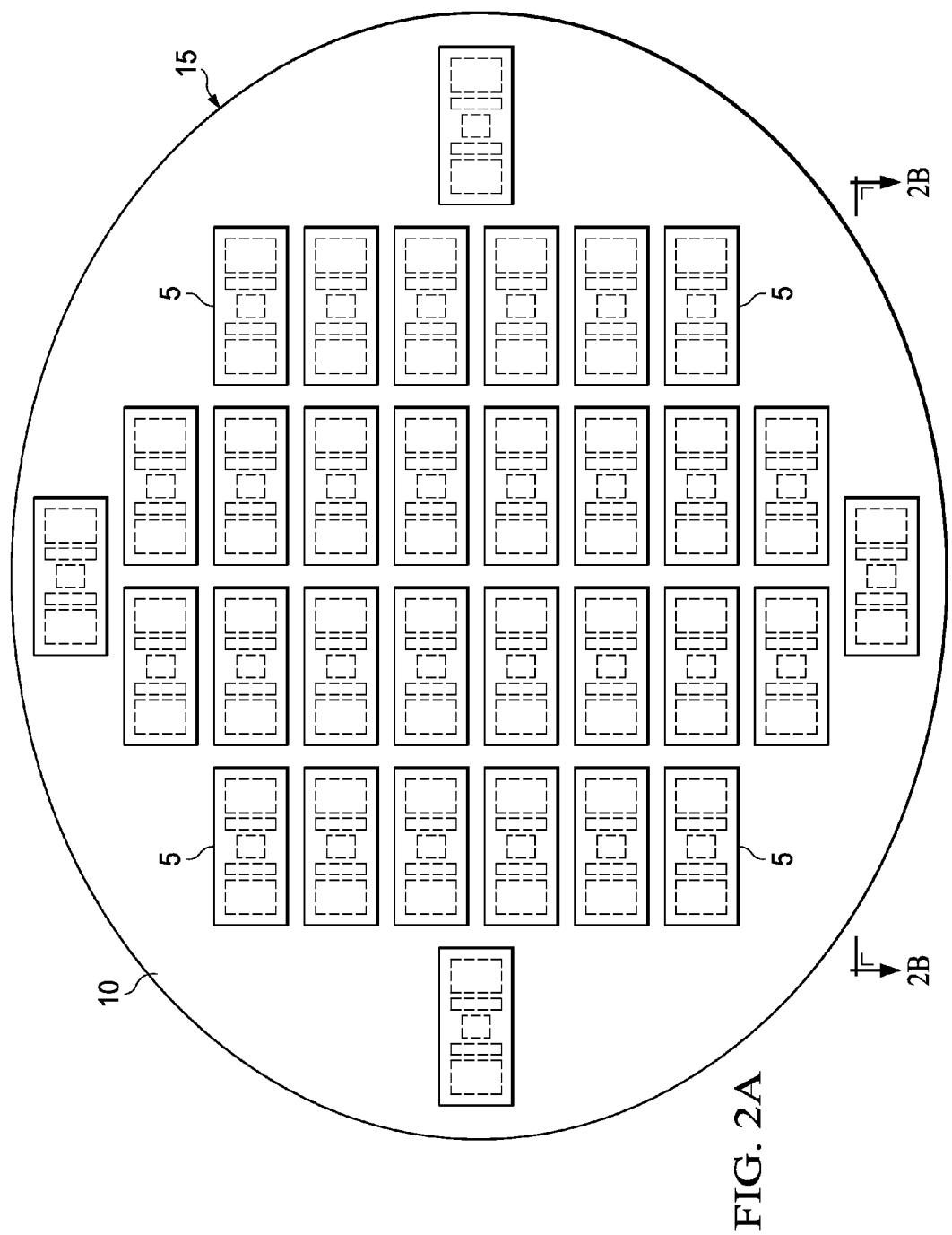

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a wafer level package or an embedded wafer level package. The invention may also be applied, however, to other types of semiconductor devices.

Embodiments of the invention overcome the problems in integrating a plurality of different sized chips into a single package using wafer level processing. A structural embodiment will be described using FIG. 1. Further structural embodiments will be described using FIGS. 2K, 3E, 4C, 5H, 6, 7, and 8. A method of forming the semiconductor package will be described using FIGS. 2 and 3. Alternative embodiments of the fabricating the package will be described using FIGS. 4 and 5.

FIG. 1, which includes FIGS. 1A and 1B, illustrates a semiconductor package having a plurality of dies in accordance with embodiments of the invention, wherein FIG. 1A illustrates a cross-sectional view and FIG. 1B illustrates a top view.

Referring to FIG. 1A, a first die 110, a second die 120, and a third die 130 are embedded within an encapsulant. The first die 110 is separated and therefore isolated from the third die 130 by a portion of the encapsulant 90. Similarly, the second die 120 is isolated from the third die 130 by a portion of the encapsulant 90.

In various embodiments, the first, the second, and the third dies 110, 120, and 130 may be any type of dies. In one embodiment, the first die 110 is different from the second and the third dies 120 and 130. In another embodiment, the second die 120 is also different from the first and the third dies 110 and 130.

In one embodiment, the first die 110 is a vertical semiconductor device wherein the current flow in an active region is oriented in a vertical direction while the third die 130 is a lateral semiconductor device wherein the current flow in the active region is oriented in a lateral direction. The vertical direction is oriented from the top major surface to the bottom major surface of the first die 110 (or vice versa) while the lateral direction is oriented from the left side minor surface to the opposite right side minor surface of the third die 130 (or vice versa). Similarly, in one embodiment, the second die 120 is a vertical semiconductor device.

As illustrated, the first die 110 and the second die 120 have electrical back side contacts while the third die 130 does not. This may be needed in one embodiment because of the vertical current flow of these dies.

A backside seed layer 160 is disposed on the back surface of the first and the second dies 110 and 120. A backside conductor 180 is disposed under the backside seed layer 160. In one embodiment, the backside seed layer 160 and the backside conductor 180 comprise copper and copper alloys. The backside seed layer 160 may be a seed for the subsequent formation of the backside conductor 180. The backside seed layer 160 may also include a diffusion barrier to prevent atoms from the backside conductor 180 to get into the encapsulant 90. In other embodiments, the backside seed layer 160 and the backside conductor 180 comprise other conductive materials including Ti, TiN, Ta, TaN, doped polysilicon, aluminum, platinum, silver, gold, hafnium, nickel silicide, cobalt silicide, titanium silicide.

A bottom surface of the third die 130 is also covered with the encapsulant 90. Thus, the third die 130 is isolated from the backside conductor 180 by a portion of the encapsulant 90.

A through via 170 is disposed in the encapsulant 90 and electrically couples the back side with the front side. The through via 170 is an electrical conductor, for example, comprising copper in one embodiment. A through via 170 may not be present in alternative packaging options, for example, in case a wire bond connects the back side of the package to the front side of the package.

In one embodiment, the first die 110 and the second die 120 may comprise a discrete transistor. The first die 110 has a first die drain contact 30 and a first die gate contact 40 on a top surface and a first die source contact 20 on an opposite bottom surface. The second die 120 has a second die source contact 70 and a second die gate contact 80 on the top surface and a second die drain contact 60 on an opposite bottom surface.

A front side redistribution layer 150 is disposed over the encapsulant 90, and over the first die 110, the second die 120, and the third die 130. The front side redistribution layer 150 comprises redistribution lines, which are metal lines and may be embedded in dielectric layers. The metal lines within the front side redistribution layer 150 couple to the various contacts on the dies. For example, the second die source contact 70 and the second die gate contact 80 are contacted through the redistribution lines in the front side redistribution layer 150. Similarly, the first die drain contact 30 and the first die gate contact 40 are coupled to the front side redistribution layer 150. The top surface of the third die 130 has a plurality of contacts structures that are coupled to the front side redistribution layer 150.

The package has a plurality of contacts disposed over the front side redistribution layer 150. In one embodiment, the plurality of contacts comprises solder balls 220. In various embodiments, the plurality of contacts comprises any suitable contact structure.

FIG. 1B illustrates a top view of the semiconductor package in accordance with an embodiment of the invention.

The encapsulant 90 has the first die 110 having the first die drain contact 30 and the first die gate contact 40 and the second die 120 with the second die source contact 70 and the second die gate contact 80. The shapes and location of the contacts are shown as an example. In various embodiments, the shape and location of the contacts may be different. Similarly, the through via 170 may also be shaped differently in various embodiments.

In one embodiment, the semiconductor package is a DC-DC converter formed by connecting a high side power chip (e.g., second die 120) in series with a low side power chip (e.g., first die 110). An IC chip (e.g., third die 130) controls the operations and for monitoring electrical signals. Advantageously, the third die 130 is isolated from the first die 110 and the second die 120 using the encapsulant 90 without additional isolation. Nevertheless, high isolation is obtained between the dies, e.g., a dielectric strength above 100 MV/m may be obtained.

FIG. 2, which includes FIGS. 2A-2K, illustrates a semiconductor package during various stages of manufacturing in accordance with embodiments of the present invention.

FIG. 2A illustrates a top view of a carrier 10 supporting a plurality of packages 5. An adhesive layer 15 may be disposed on a top surface of the carrier 10 to provide mechanical support during processing. The carrier 10 may comprise any suitable shape and may hold a large number of packages. In one embodiment, the carrier 10 comprises a circular shape, for example, having a 8" or 12" diameter. In another embodiment, the carrier 10 is rectangular in shape.

FIGS. 2B-2K illustrates a cross-sectional portion of the carrier 10 illustrated in FIG. 2A.

As will be described in further detail in FIGS. 2B-2K, the plurality of packages 5 are simultaneously formed in various embodiments of the invention.

Figure 2B:
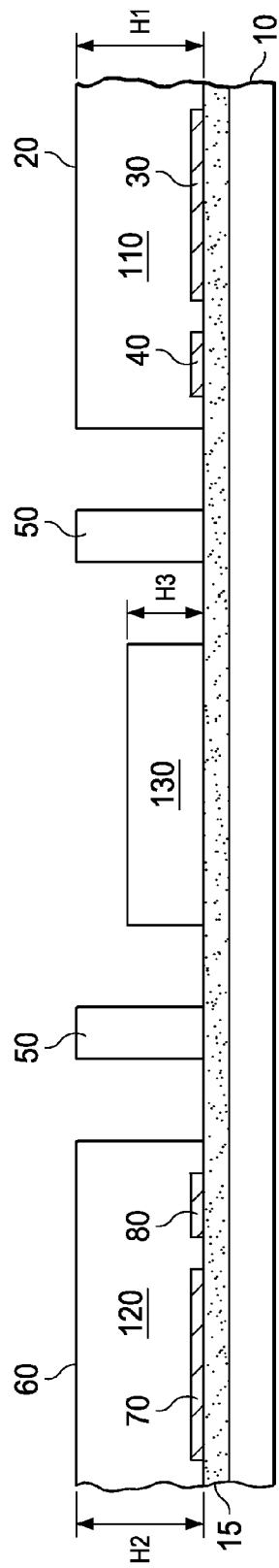

Referring to FIG. 2B, the plurality of packages 5 are placed over a carrier 10. Each package of the plurality of packages 5 may include a large number of dies. The dies in each package 5 may comprise any type of dies and may be different from each other. In one embodiment, two dies are placed over the carrier 10. In other embodiments, more than two dies are placed over the carrier 10. In the illustrated embodiment, each package comprises a first die 110 having a first die source contact 20, a first drain contact 30, and a first gate contact 40, and a second die 120 having a second drain contact 60, a second die source contact 70, and a second die gate contact 80.

A third die 130 is also placed over the carrier 10. In one embodiment, the third die 130 is different from the first die 110 and the second die 120. In one embodiment, the first die 110 and the second die 120 are power devices. In one embodiment, the first die 110 and the second die 120 is a power metal insulator semiconductor field effect transistor (MISFET) or an insulated gate bipolar transistor (IGBT) while the third die 130 is a logic chip and has no functional back side, i.e, no electrical backside contacts. In one embodiment, the first die 110 is a low side power chip and the second die 120 is a high side power chip of a DC-DC converter.

In one embodiment, the first die 110 has a first height H1, the second die has a second height H2, and the third die 130 has a third height H3. The first die H1 is greater than the third height H3 and the second die H2 is greater than the third height H3. In one embodiment, the first height H1 is about the same as the second height H2.

The location/placement of the first die 110 and the second die 120 relative to the third die 130 is monitored and controlled. The separation between the first die 110 and the third die 130 (similarly between the second die 120 and the third die 130) determines the possibility of breakdown due to high electric fields. Similarly, the thickness of the encapsulant 90 is controlled to ensure proper isolation between the dies.

Further, in some embodiments, a semiconductor pillar 50 is placed between the dies. In one case, the semiconductor pillars 50 may be placed between the first die 110 and the third die 130 and between the second die 120 and the third die 130.

In one embodiment, the semiconductor pillar 50 is monocrystalline silicon. In one or more embodiments, the semiconductor pillar 50 has an exposed surface having a {111}, {110}, or {100} crystal plane of silicon. The semiconductor pillar 50 has a height greater than the third die 130, and about the same height as the first die 110 in one embodiment. In various embodiments, the semiconductor pillar 50 may have a height greater than the first die 110 in some embodiments.

Figure 2C:
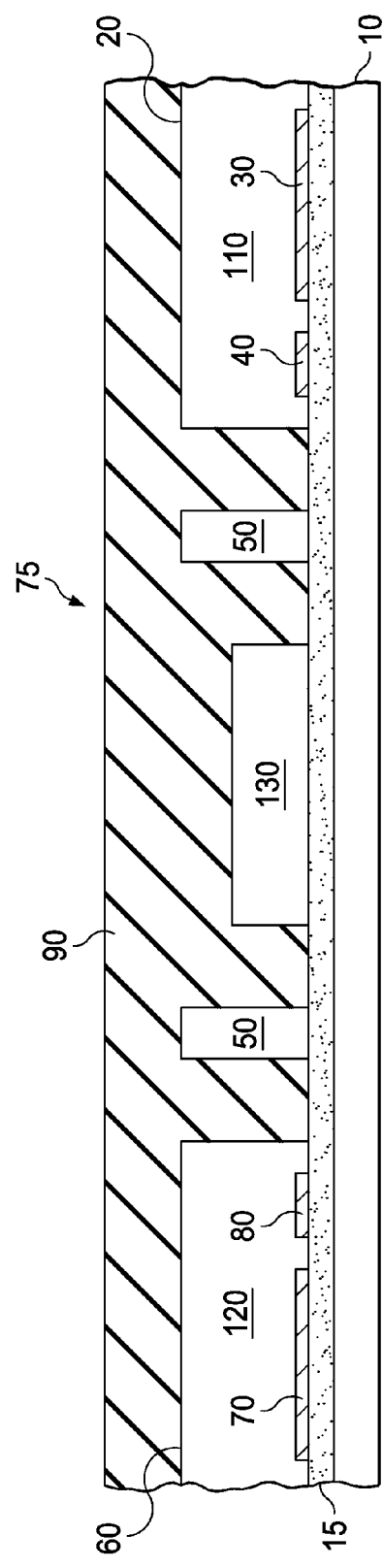

Referring to FIG. 2C, a reconstituted wafer 75 comprising the plurality of packages is formed. An encapsulant 90 having an encapsulation material is formed over and between the dies. In one embodiment, the encapsulation material such as a mold compound is added by compression molding. In such an embodiment, after covering the dies with the mold compound, a curing process is performed to form the encapsulant 90. In alternative embodiments, other types of molding such as transfer molding, injection molding may be used.

In other embodiments, the encapsulation material may comprise a polymer, a biopolymer, a fiber impregnated polymer (e.g., carbon or glass fibers in a resin), a particle filled polymer, and other organic materials. In one or more embodiments, the encapsulation material comprises a sealant not formed using a mold compound, and materials such as epoxy resins and/or silicones. In various embodiments, the encapsulation material may be made of any appropriate duroplastic, thermoplastic, or thermosetting material, or a laminate. The material of the encapsulation material may include filler materials in some embodiments. In one embodiment, the encapsulation material may comprise epoxy material and a fill material comprising small particles of glass or other electrically insulating mineral filler materials like alumina or organic fill materials.

The encapsulation material may be cured, i.e., subjected to a thermal process to harden thus forming a hermetic seal protecting the first and the second dies 110 and 120.

Thus, after the encapsulation, the dies within each package are embedded within the encapsulant 90, which now forms an artificial or reconstituted wafer 75 having the shape of the carrier (See FIG. 2A).

Referring to FIG. 2D, the carrier 10 is flipped exposing the bottom surface 85 of the reconstituted wafer 75. Next, as illustrated in FIG. 2E, the carrier 10 is separated from the reconstituted wafer 75 exposing the top surface 95 of the reconstituted wafer 75. Because of the mechanical stability of the encapsulant 90, further processing may be performed with the reconstituted wafer 75. In other words, the wafer level processing may be performed using the reconstituted wafer 75.

Figure 2F:
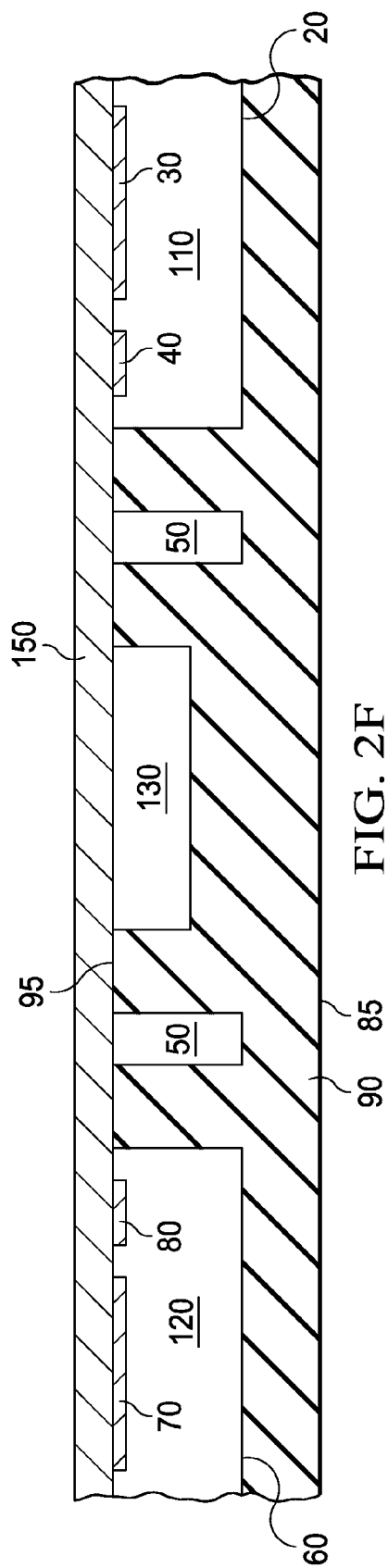
Figure 3A:
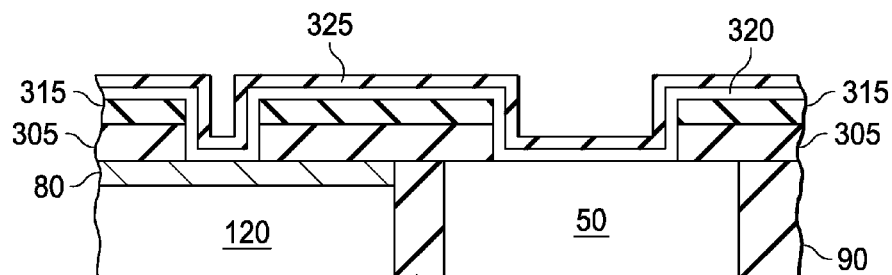
Figure 3B:
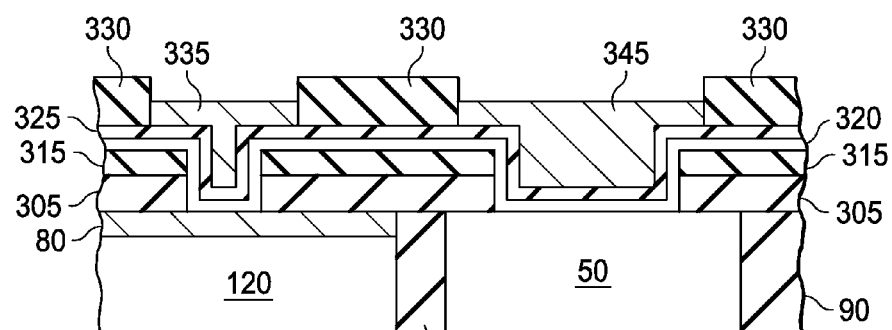
Figure 3C:
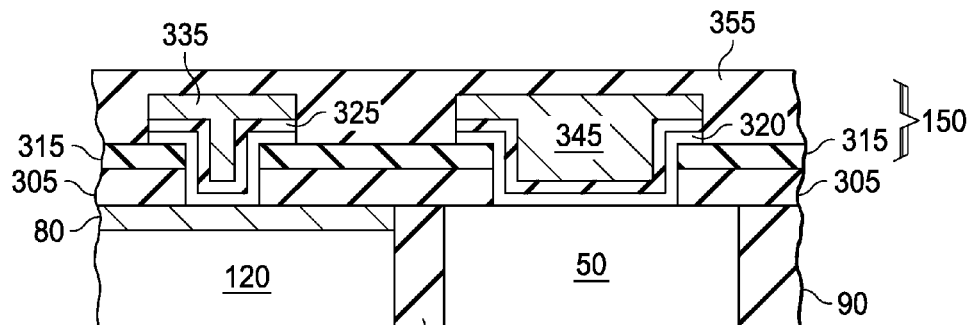

Referring to FIG. 2F, a front side redistribution layer 150 is formed over the top surface 95 of the reconstituted wafer 75. The front side redistribution layer 150 includes metal lines disposed within a dielectric layer to electrically connect the various contact pads on the dies to external input/output pads as well as interconnecting the dies. FIGS. 3A-3C illustrate further details of one embodiment of forming the front side redistribution layer 150.

Figure 2G:
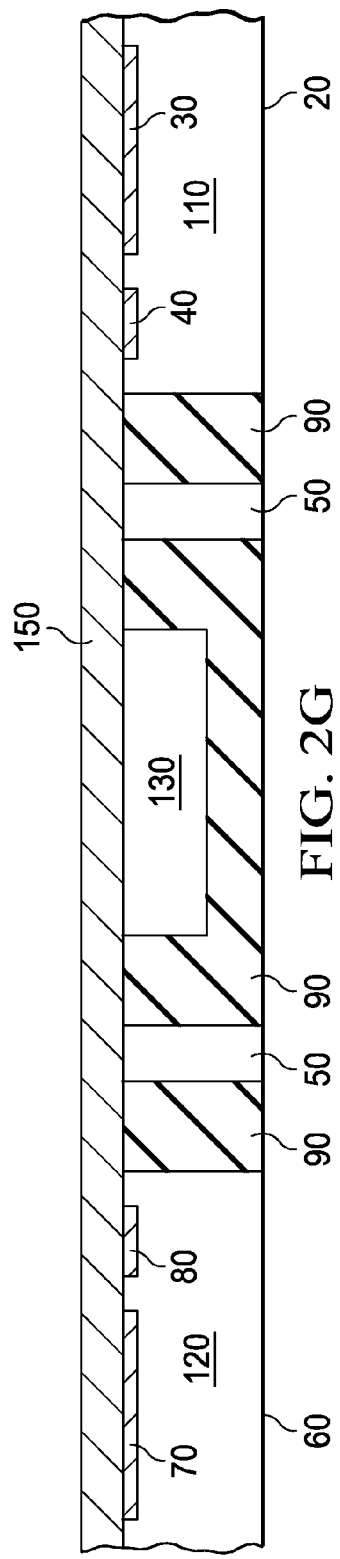

Referring next to FIG. 2G, the bottom surface 85 of the reconstituted wafer 75 is exposed to a thinning process. In various embodiments, thinning may be performed mechanical and/or chemically. In one embodiment, the thinning process comprises a grinding process. The thinning process may be stopped after a semiconductor region of the first die 110 and a semiconductor region of the second die 120 are exposed or the thinning process is continued to reach to the desired thickness for first die 110 and second die 120. However, the third die 130 remains covered with a layer of the encapsulant 90 because the third die 130 is thinner than the first die 110 or the second die 120. In various embodiments, the thickness of the reconstituted wafer 75 before thinning is at least 200 µm, and at least about 500 µm in one embodiment. In various embodiments, the thickness of the reconstituted wafer 75 after thinning is less than about 100 µm, and about 30 µm to about 50 µm in one embodiment. In various embodiments, the thickness of the reconstituted wafer 75 after thinning is less than about 50 µm, and about 10 µm to about 50 µm in one embodiment. The thinning advantageously lowers the resistance of the vertical devices such as the first die 110 or the second die 120.

As next illustrated in FIG. 2H, the reconstituted wafer 75 is subjected to a selective etching process. The selective etching process selectively removes the semiconductor material from the back side of the first die 110 and the second die 120 without substantially etching the encapsulant 90. Advantageously, using a selective etching process avoids the need for a separate masking step to cover the regions to be protected during the etching. Further, the etching process completely removes the semiconductor pillar 50. The etch selectivity may be improved because of the crystal orientation of the first and the second dies 110 and 120 and the semiconductor pillar 50. As an example, the back surface of the first and the second dies 110 and 120 are oriented along {100} crystal plane while the back surface of the semiconductor pillar 50 is oriented along {110} or {111}. An etchant may be selected that etches faster along {110} or {111} relative to {100} so that the semiconductor pillar 50 is completely etched before etching the first and the second dies 110 and 120. Examples of such etchants that have crystallographic selectivity include KOH.

In another example, in one embodiment, the back surface of both the first and the second dies 110 and 120 and the semiconductor pillar 50 are oriented along {100} crystal plane. Consequently, an etchant may be selected to have a high etch rate for {100} crystal planes. Further, the semiconductor pillar 50 may be completely removed without removing the first and the second dies 110 and 120 because of the smaller volume of the semiconductor pillar 50.

In various embodiments, the etching may be stopped using an end point detection scheme, or a timed etch. In some embodiments, the first die 110 and the second die 120 may include an etch stop liner for stopping the etching. For example, in one embodiment, the first die 110 and the second die 120 may comprise semiconductor-on-insulator substrates so that the etching stops after reaching the buried insulator region.

Advantageously, the use of the selective etching avoids the need for additional mask step. Otherwise, the backside of the reconstituted wafer 75 has to be subjected to a lithography process so that only the areas under the first die 110 and the second die 120 are exposed to the subsequent metallization process while the areas under the third die 130 are covered by a resist layer. Although not as effective as the selective etching processes described above, embodiments also include conventional lithography based patterning and etching.

Next, as illustrated in FIG. 2I, a backside redistribution layer is formed on the back side of the reconstituted wafer 75. A backside seed layer 160 is deposited under the reconstituted wafer 75. In various embodiments, the backside seed layer 160 has thickness of about 50 nm to about 300 nm. The backside seed layer 160 may be deposited using a suitable deposition process such as sputtering, chemical vapor deposition, atomic layer deposition, or other deposition processes. In various embodiments, the backside seed layer 160 comprises copper or other metals like Al, W, Ag, Au, Ni, or Pd. An optional barrier layer may be deposited prior to depositing the backside seed layer 160. The barrier layer is intended to protect diffusion of metal atoms from the backside seed layer 160 and the subsequent conductor into the first die 100 or the second die 120.

Figure 2J:
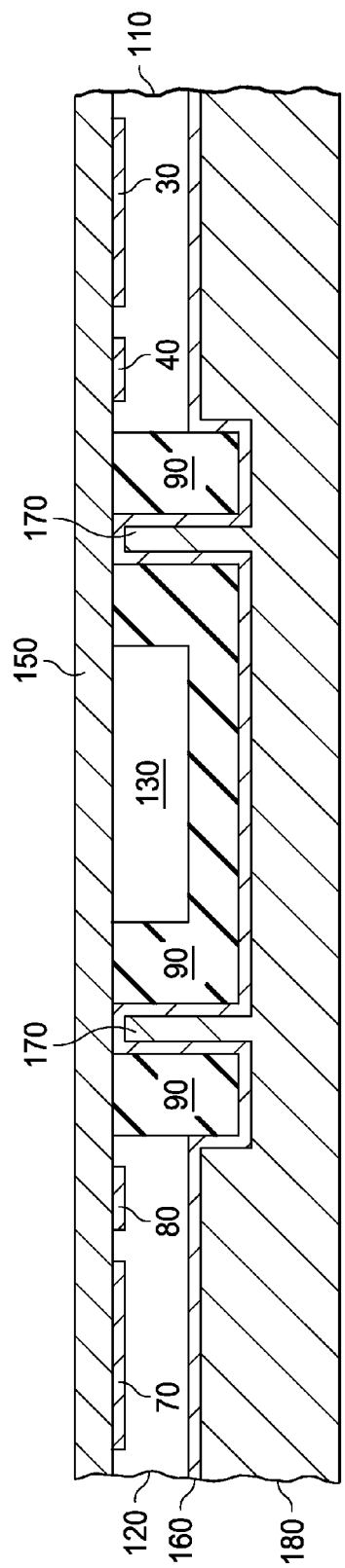

Referring next to FIG. 2J, a backside conductor 180 is formed under the backside seed layer 160. In various embodiments, the backside conductor 180 is formed using an electro deposition process and may comprise electroplating in one embodiment. In alternative embodiments, the backside conductor 180 may be deposited using other processes such as sputtering, vapor deposition etc. In various embodiments, the backside conductor 180 comprises copper, although in some embodiments, other suitable conductors are used. In various embodiments, the backside conductor 180 may comprise multiple layers, for example, Cu/Ni, Cu/Ni/Pd/Au, Cu/Ni-MoP/Pd/Au, or Cu/Sn, in one embodiment.

The backside conductor 180 couples the contact area (first die source contact 20) from the backside of the first die 110 with the front side redistribution layer 150 using the through via 170. Similarly, the backside conductor 180 couples the contact area (second die drain contact 60) from the backside of the second die 120 with the front side redistribution layer 150 using the through via 170. Further, as illustrated in FIG. 2J, the second drain contact 60 of the second die 120 is coupled to the first die source contact 20 of the first die 110.

Figure 2K:
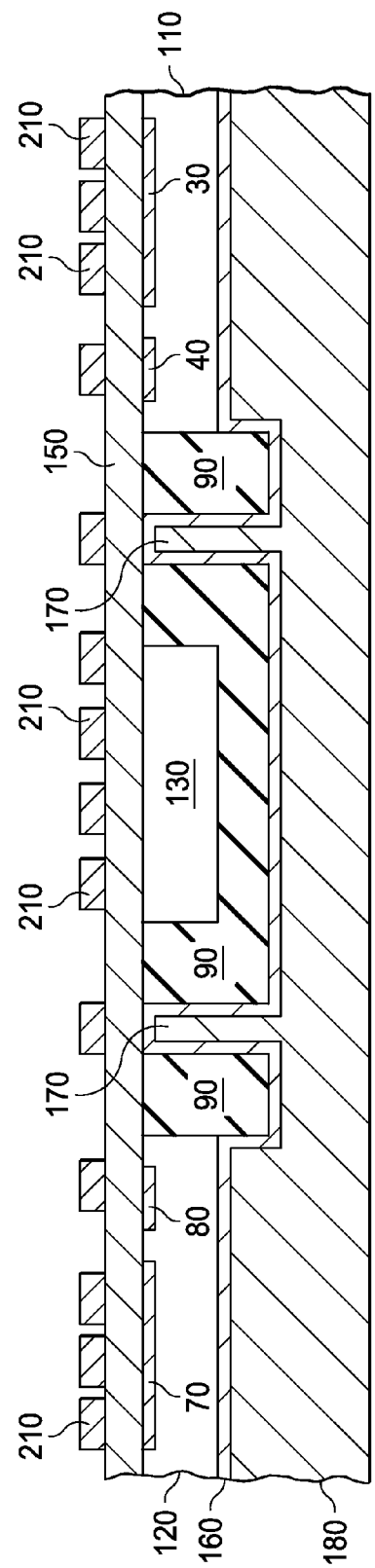

Next, as illustrated in FIG. 2K, contacts 210 are formed over the front side of the reconstituted wafer 75. The contacts 210 may be in various shapes, types, structures etc. in various embodiments. In various embodiments contacts 210 may be leadless contacts, bumps, bars, balls etc. The illustrated embodiment shows contact electrodes in one embodiment.

The reconstituted wafer 75 may be singulated to form separate semiconductor packages. For example, the various packages within the reconstituted wafer 75 may be diced mechanically.

FIG. 3, which includes FIGS. 3A-3E, illustrates an alternative embodiment of forming a semiconductor package having a plurality of different sized dies.

Unlike the prior embodiment which showed contact electrodes, in this embodiment solder balls are formed. Further, as an illustration, this embodiment describes further detail regarding the front side redistribution layer formation. Processing continues as described previously in FIGS. 2A-2E. Next, as illustrated in FIG. 2F, a front side redistribution layer 150 is formed. FIGS. 3A-3C provide further details of forming a front side redistribution layer 150 in accordance with an embodiment of the invention.

A passivation layer 305 is deposited over the over the contact pads of the first and the second dies 110 and 120 and the semiconductor pillar 50. The passivation layer 305 is formed over the last metal line of the third die 130. In some embodiments, the passivation layer 305 may be formed in prior steps. As an illustration, FIG. 3A shows a magnified cross-section showing the second die gate contact 80 over the second die 120 and the semiconductor pillar 50.

The passivation layer 305 is an insulating layer and in one embodiment comprises an oxide layer or an oxide/nitride layer stack. A first dielectric layer 315 is formed over the passivation layer 305. In various embodiments, the first dielectric layer 315 is formed using a coating process, for example, by a spin-on process although in other embodiments, the first dielectric layer 315 is applied using a chemical vapor deposition process. In various embodiments, the first dielectric layer 315 comprises organic polymer, benzocyclobutene based polymer, polyimide, photoimide or inorganic dielectric.

A liner 320, which may be conductive, is deposited. The liner 320 contacts the contact areas of the dies such as the second die gate contact 80. The liner 320 also contacts the semiconductor pillar 50. Although not shown, the liner 320 contacts the contact pads of the third die 130. In various embodiments, the liner 320 is deposited using a deposition process to form a conformal layer comprising Ti, Ta, Ru, W, combinations thereof, or a nitride, silicide, carbide thereof. Examples of such combinations include TiN, TaN, and WN, and TiW. In various embodiments, the liner 320 is deposited using a chemical vapor deposition, plasma vapor deposition or atomic layer deposition. In various embodiments, the liner 320 comprises a thickness of about 20 nm to about 200 nm. The liner 320 may be a diffusion barrier.

A seed layer 325 is deposited on the liner 320. The seed layer 325 covers the liner 320. In various embodiments, the seed layer 325 is deposited using a deposition process to form a conformal layer. In various embodiments, the seed layer 325 is deposited using a sputter deposition process, a chemical vapor deposition, plasma vapor deposition or atomic layer deposition. In various embodiments, the seed layer 325 comprises a thickness of about 20 nm to about 200 nm. The seed layer 325 provides seeds for the electroplating process. In various embodiments, the seed layer 325 comprises copper or other metals like Al, W, Ag, Au, Ni, or Pd. The seed layer 325 comprises a same material as the material of the subsequent metal lines to enable electroplating, in one embodiment.

As next illustrated in FIG. 3B, a photo resist layer 330 is deposited. In various embodiments, the photo resist layer 330 is several microns thick, and varies from about 1 μm to about 10 μm, in one embodiment. The photo resist layer 330 is patterned, for example, using conventional lithography. The patterned photo resist layer 330 comprises patterns for redistribution metal lines and pad vias.

Redistribution metal lines and contact pads are formed by electroplating a fill metal over the seed layer 325. In alternative embodiments, the redistribution metal lines and contact pads may also be deposited using other processes such as sputtering, vapor deposition etc. In one embodiment, a first contact pad 335 is formed over the second die gate contact 80. A second contact pad 345 over the semiconductor pillar 50. The redistribution metal lines couple the contact areas of the first die 110 to the third die 130 and couple the contact areas of the second die 120 to the third die 130. In various embodiments, the fill metal comprises copper, although in some embodiments, other suitable conductors are used. In various embodiments, the redistribution metal lines may comprise multiple layers, for example, Cu/Ni, Cu/Ni/Pd/Au, Cu/Ni-MoP/Pd/Au, or Cu/Sn, in one embodiment.

Referring to FIG. 3C, the patterned photo resist layer 330 is stripped to expose the seed layer 325. The exposed seed layer 325 and the underlying liner 320 are next etched away using, for example, a wet etch chemistry.

A second dielectric layer 355 is deposited over the redistribution metal lines and the first and the second pads 335 and 345. The second dielectric layer 355 covers the front side redistribution metal lines and bump pads and protects the front side redistribution layer 150 during subsequent processing.

In various embodiments, the second dielectric layer 355 is coated, for example, by a spin-on process or applied using a chemical vapor deposition process. In various embodiments, the second dielectric layer 355 comprises organic polymer, benzocyclobutene based polymers, polyimide, photoimide or inorganic dielectric.

Subsequent processing continues as described with respect to FIGS. 2G-2K. Consequently, the semiconductor pillar 50 is filled with a backside seed layer 160 and a backside conductor 180.

Figure 3D:
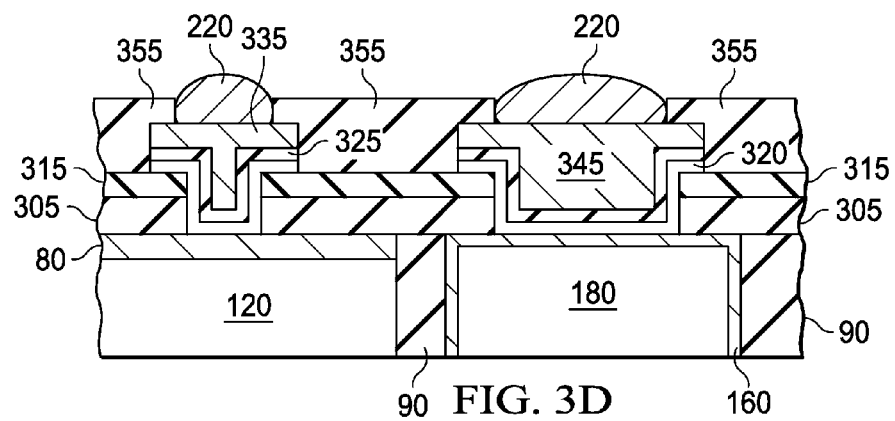

FIGS. 3D and 3E illustrate the semiconductor device after forming solder ball contacts, wherein FIG. 3D illustrates a magnified cross-sectional view and wherein FIG. 3E illustrates a cross-sectional view of the package showing all the dies after the formation of the solder balls 220.

Next, as illustrated in FIG. 3D, the second dielectric layer 355 is patterned using lithography thereby exposing the first and the second pads 335 and 345.

Solder balls 220 are formed after the formation of the opening over the first and the second pads 335 and 345. The solder balls 220 are isolated by the second dielectric layer 355. In various embodiments, a solder flux and a solder fill material may be deposited over the first and the second pads 335 and 345. The solder fill material is electroplated in one embodiment, although, in other embodiments, other processes such as electroless plating or deposition processes such as vapor deposition may also be used. The solder fill material may be a single layer or comprise multiple layers with different compositions. For example, in one embodiment, the solder fill material comprises a lead (Pb) layer followed by a tin (Sn) layer. In another embodiment, a SnAg layer may be deposited as the solder fill material. Other examples include SnPbAg, SnPb, PbAg, PbIn, and lead free materials such as SnBi, SnAgCu, SnTn, and SiZn. In various embodiments, other suitable materials may be deposited.

A thermal treatment is performed to form the solder balls 220. The thermal treatment reflows the solder fill material and the heating forms the solder balls 220. For example, in the embodiment when Pb/Sb layer is deposited, after reflow, high lead alloys including 95 Pb/5 Sn (95/5) or 90 Pb/10 Sn (95/10) with melting temperatures in excess of 300° C. are formed. In a different embodiment, eutectic 63 Pb/37 Sn (63/37) with a melting temperature of about 183° C. is formed. Similarly, lead free solder balls 220 may be formed that comprises a composition of 97.5 Sn/2.6 Ag (97.5/2.5). The solder balls 220 may comprise a homogeneous material having a defined melting temperature in one embodiment. For example, the high melting Pb/Sn alloys are reliable metallurgies which are particularly resistant to material fatigue. The metal from the first and the second pads 335 and 345 may also diffuse and intermix during the thermal treatment. However, the liner 320 is stable during heating and may protect the inter diffusion of metal atoms.

FIG. 4, which includes FIGS. 4A-4C, illustrates an alternative embodiment of forming a semiconductor package having at least two dies of different sizes.

This embodiment is similar to the embodiment illustrated in FIG. 2A-2I up to the formation of the backside seed layer 160. However, after the formation of the backside seed layer 160 a backside resist 165 is deposited and patterned. Consequently, the backside conductor 180 does not grow over the backside resist 165.

In various embodiments, the backside resist 165 may comprise an organic layer including photo resist layers, anti-reflective coating as well as a hard mask layer such as an oxide and/or nitride layers. The backside resist 165 is formed so as to form backside metal lines on the backside of the reconstituted wafer 75.

Referring next to FIG. 4B, a backside conductor 180 comprising backside redistribution metal lines (e.g., a first backside metal line 181 and a second backside metal line 182) are formed by electroplating a fill metal under the backside seed layer 160. In various embodiments, the backside conductor 180 comprises copper, although in some embodiments, other suitable conductors are used. The backside conductor 180 may comprise a pure metal, which may include trace impurities, 100% pure metal, or an alloy. In various embodiments, the backside conductor 180 may comprise multiple layers, for example, Cu/Ni, Cu/Ni/Pd/Au, Cu/NiMoP/Pd/Au, or Cu/Sn, in one embodiment.

In one or more embodiments, the backside redistribution metal lines couple the backside contact areas of the first die 110 and the second die 120 to the front side redistribution layer 150. In one embodiment, a first backside metal line 181 is formed under the first die source contact 20 and is coupled to a first through via 171. Similarly, a second backside metal line 182 is formed under the second die drain contact 60 and is coupled to a second through via 172.

As described previously, the backside resist 165 prevents the plating of the metal directly under it by covering the backside seed layer 160. As illustrated in one embodiment, the backside resist 165 is not formed under the third die 130 thereby the first backside metal line 181 is electrically separated from the second backside metal line 182.

In various embodiments, forming the backside conductor 180 may also include a planarization step after the electroplating so as to planarize the different backside redistribution metal lines.

Referring to FIG. 4C, the backside resist 165 is removed and the backside seed layer 160 may be removed. Subsequent processing may follow FIG. 2K by forming contacts over the front side redistribution layer 150.

Figure 5G:
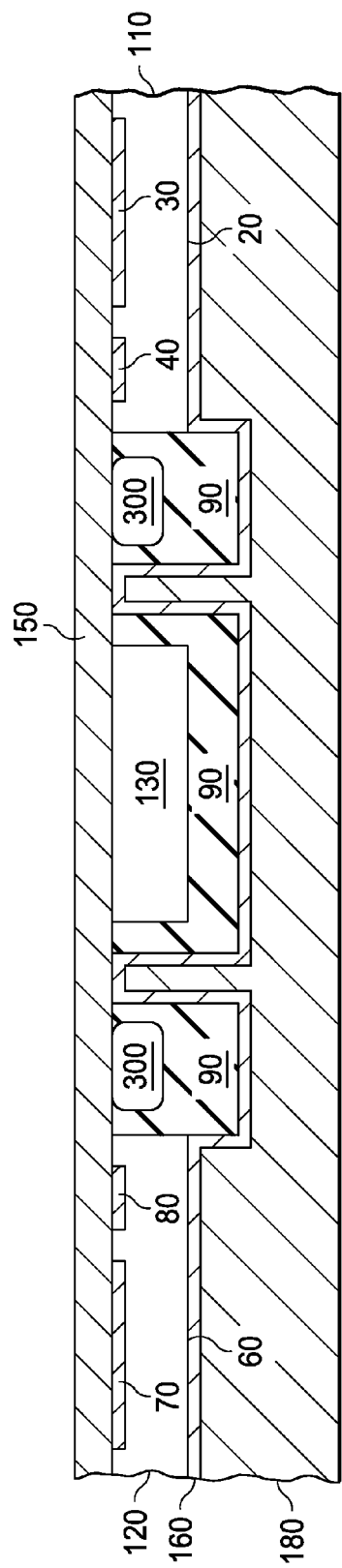
Figure 5H:
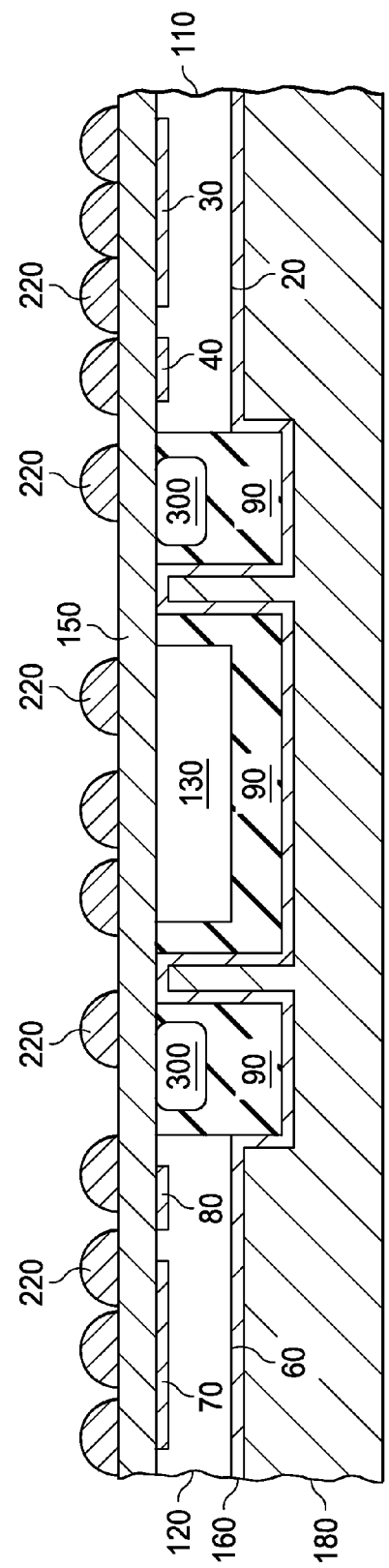

FIG. 5, which includes FIGS. 5A-5H, illustrates a semiconductor package during various stages of formation in accordance with an embodiment of the invention.

Unlike the prior embodiments described so far, this embodiment also includes passive devices. In prior embodiments, the package included a plurality of different type of dies. In this embodiment, the package may be formed by combining a die comprising active devices with another die comprising a passive device. Similarly, in an alternative embodiment, a package may comprise two dies, each of whom is a passive device.

Referring to FIG. 5A, a first die 110, a second die 120, a third die 130 is placed over a carrier 10 as in similar embodiments. In this embodiment, passive devices 300 are further placed over the carrier 10.

As in prior embodiments, the first die 110 has a first height H1, the second die has a second height H2, and the third die 130 has a third height H3. The first die H1 is larger than the third height H3 and the second die H2 is larger than the third height H3. The passive device 300 may have a fourth height H4 different from the first height H1, the second height H2, and the third height H3. In one embodiment, the passive device 300 has only front side metallization and with no back side contacts. In such an embodiment, the passive device has a fourth height H4 smaller than either the first height H1 or the second height H2.

In an alternate embodiment, the passive device 300 may have backside contacts. In such embodiments, the passive device 300 has a fourth height H4 larger than the third height H3 of the third die 130, and in one embodiment, the fourth height H4 is about the same as the first height H1 of the first die 110.

Referring to FIG. 5B, as in prior embodiments, the first, the second, the third dies 110, 120, and 130 and the passive devices are encapsulated with a mold compound to form an encapsulant 90. A reconstituted wafer 75 is thus formed over the carrier 10.

As next illustrated in FIG. 5C, the molded body is reversed to expose the bottom surface 85 of the reconstituted wafer 75. Next, the carrier 10 is released and separated from the reconstituted wafer 75 exposing the top surface 95 of the reconstituted wafer 75.

Referring to FIG. 5D, front side redistribution lines 150 are formed over the top surface 95 of the reconstituted wafer 75 as described in prior embodiments of FIGS. 2 and 3.

As next illustrated in FIG. 5E, the reconstituted wafer 75 is thinned to expose a new bottom surface. After the thinning, a bottom surface of the first die 110 and the second die 120 are exposed. However, the passive 300 and the third die 130 remain embedded within the encapsulant 90. Thus, a protective portion of the encapsulant 90 covers the passive device 300.

Referring to FIG. 5F, as described previously, a selective etch is performed to etch the semiconductor pillar 50 and partially etch the first and the second dies 110 and 120.

A backside seed layer 160 is formed under the reconstituted wafer 75 (FIG. 5G). An optional diffusion barrier may be deposited prior to forming the backside seed layer 160. A backside conductor 180 comprising backside redistribution lines is formed by an electro deposition process under the backside seed layer 160. The electro deposition process also forms the through via 170, which is now embedded within the encapsulant 90.

A plurality of contacts may be formed on the front side redistribution layer 150 (FIG. 5H). The plurality of contacts may comprise any suitable type of contacts. In one embodiment, the plurality of contacts comprises solder balls 220 as described in FIG. 3. Next, the reconstituted wafer 75 is singulated to form individual semiconductor packages.

Figure 6:
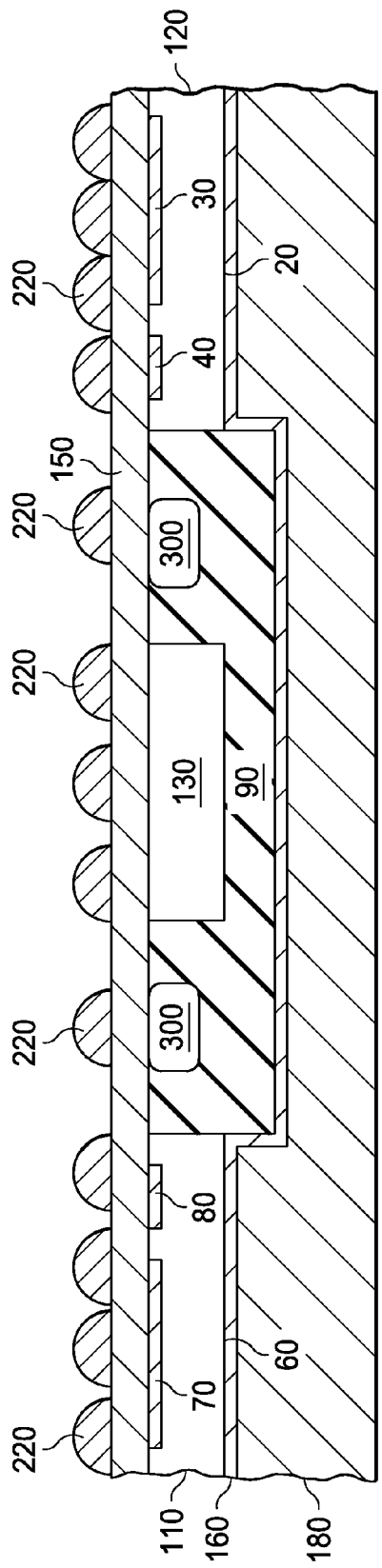
FIG. 6 illustrates an alternative embodiment of a semiconductor package having no through vias between the passive device and the third die.

FIG. 6 illustrates an alternative embodiment of a semiconductor package having no through vias between the passive device and the third die.

In some embodiments, the back side conductor may be contacted directly or a through via placed outside a region having the passive device 300 and the third die 130. Thus, as illustrated, the passive devices 300 and the third die 130 are molded within a portion of the encapsulant 90 having a uniform thickness. Advantageously such an embodiment may provide mechanical stability to the package.

Figure 7:
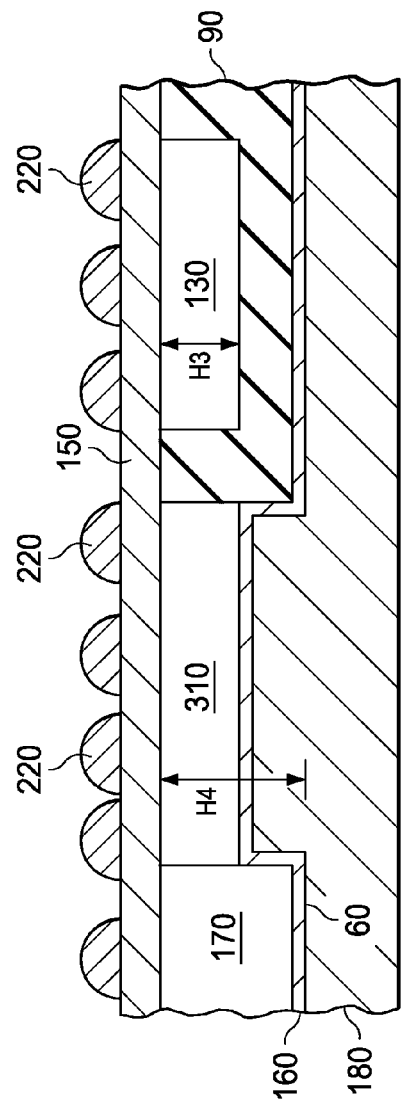
FIG. 7 illustrates a semiconductor package having a passive device with back side contacts in accordance with an alternative embodiment of the invention.

FIG. 7 illustrates a semiconductor package having a passive device with back side contacts in accordance with an alternative embodiment of the invention. In this embodiment, a second passive device 310 after die singulation has a fourth height H4 larger than the third height H3 of the third die 130. The second passive device 310 also includes backside contacts. Following, the processing described in earlier embodiments, a semiconductor package is formed. The second passive device 310 is isolated laterally by a portion of the encapsulant 90. The third die 130, which has no backside contacts, is isolated from the backside seed layer 160 and the backside conductor 180 by a portion of the encapsulant 90. As an illustration, solder balls 220 are formed over the front side redistribution layer 150.

Figure 8A:
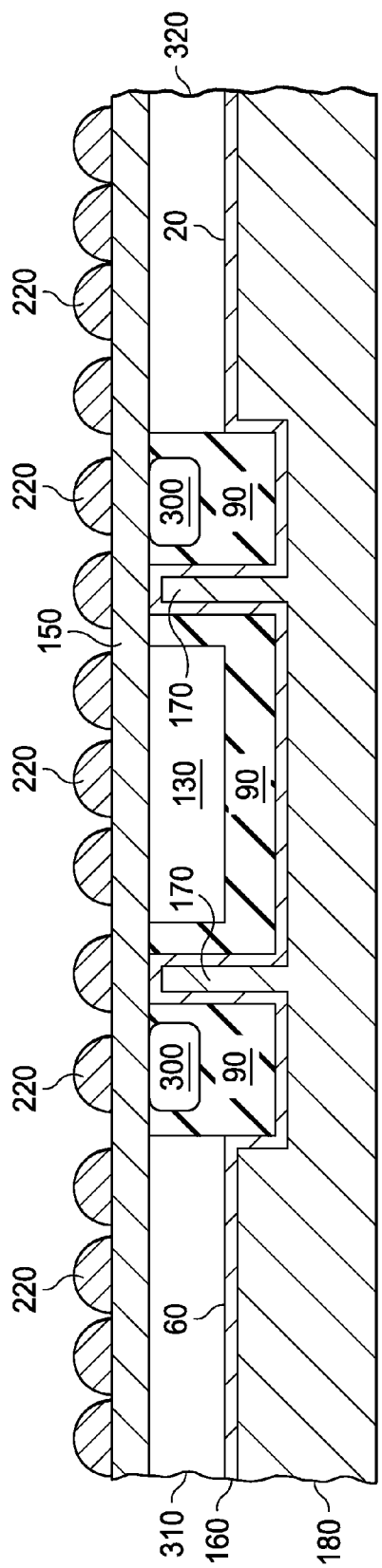
FIGS. 8A and 8B, illustrates a semiconductor package having a passive device with back side contacts in accordance with an alternative embodiment of the invention.
Figure 8B:
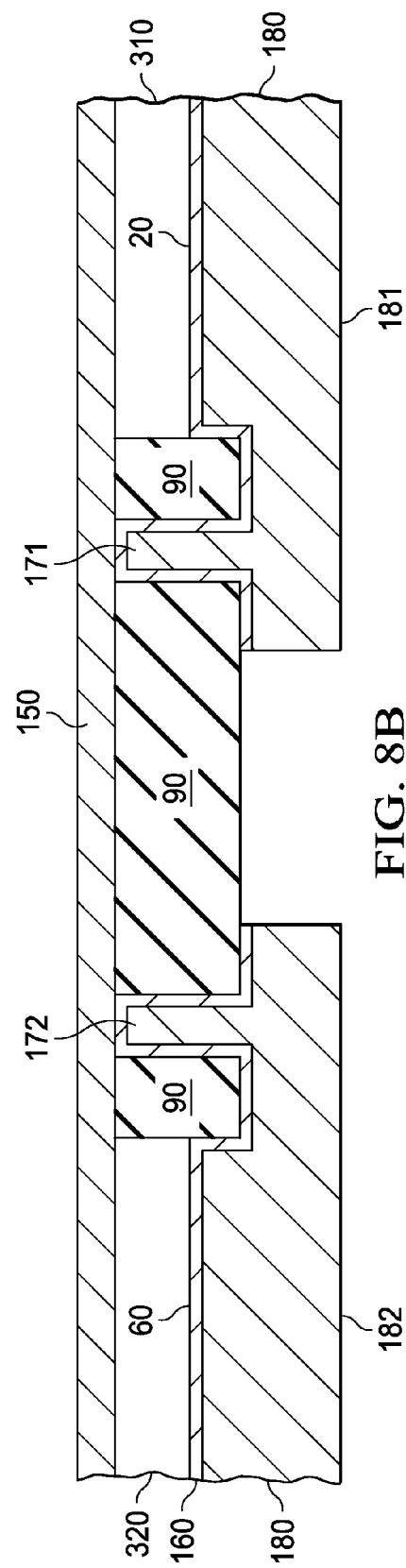

FIG. 8, which includes FIGS. 8A and 8B, illustrates a semiconductor package having a passive device with back side contacts in accordance with an alternative embodiment of the invention.

Referring to FIG. 8, passive devices 300 and the third die 130 are embedded within the encapsulant 90. The manufacturing process may be similar to that described in prior embodiments. In one embodiment, a second passive device 310 and a third passive device 320 may be serially coupled (FIG. 8A). Optionally, the second and the third passive device 310 and 320 may be coupled to the front side redistribution layer 150 using the through vias 170 (see also FIG. 8B). As is clear from these illustrations, in various embodiments, any combination of active and passive device dies may be integrated in to a single semiconductor package.

FIG. 8B illustrates an alternative embodiment in which the second passive device 310 is coupled through a first backside redistribution line 181 to the front side redistribution layer 150 while a third passive device 320 is coupled through a second backside redistribution line 182 to the front side redistribution layer 150.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 3 may be combined with the embodiments described in FIG. 1, 2, 4, 5-8 or FIG. 2 may be combined with embodiments described using FIG. 1, 4, 5, 6, 7, or 8. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor package, the method comprising:
    placing a first die and a second die over a carrier, the first die being a different type of die from the second die;
    covering at least one of the first and the second dies with an encapsulation material to form a encapsulant having a top surface and an opposite bottom surface;
    placing a pillar over the carrier before covering the first and the second dies with the encapsulation material;
    thinning the encapsulant from the bottom surface to expose a first surface of the first die without exposing the second die; and
    forming a back side conductive layer contacting the first die, wherein the second die is separated from the back side conductive layer by a first portion of the encapsulant; and
    removing the pillar completely after thinning the encapsulant.

2. The method of claim 1, further comprising selectively etching the exposed first surface of the first die to expose a second surface of the first die after thinning the encapsulant.

3. The method of claim 1, wherein a thickness of the encapsulant before the thinning is at least 500 μm, and wherein the thickness of the encapsulant after the thinning is about 10 μm to about 200 μm.

4. The method of claim 1, further comprising:
    separating the encapsulant from the carrier to expose the bottom surface.

5. The method of claim 1, further comprising:
    filling the through opening to form a through via.

6. The method of claim 5, wherein the pillar is placed between the first and the second dies.

7. The method of claim 5, wherein removing the pillar comprises performing an etching process, and wherein the etching process thins the first die by etching through the exposed first surface of the first die to expose a second surface of the first die.

8. The method of claim 5, wherein the pillar is a silicon material.

9. The method of claim 1, further comprising forming a front side redistribution layer over the top surface.

10. The method of claim 1, further comprising:
    placing a passive device over the carrier before covering the first and the second dies with the encapsulation material.

11. The method of claim 10, wherein the passive device has a vertical height smaller than a vertical height of the first die such that a bottom surface of the passive device remains covered by a second portion of the encapsulant after the thinning of the encapsulant.

12. The method of claim 10, wherein the passive device has a vertical height greater than a vertical height of the second die such that a bottom surface of the passive device is exposed after the thinning of the encapsulant, wherein forming the back side conductive layer further comprises contacting the bottom surface of the passive device.

13. The method of claim 1, wherein the first die is a discrete vertical field effect transistor, and wherein the second die is an integrated circuit chip.

14. A method of forming a semiconductor package, the method comprising:
    placing a first die and a second die over a carrier;
    placing a semiconductor pillar adjacent the first and the second dies over the carrier;
    covering the first and the second dies and the semiconductor pillar with an encapsulation material to form a encapsulant having a top surface and an opposite bottom surface;
    separating the encapsulant from the carrier to expose the bottom surface;
    thinning the encapsulant from the bottom surface to expose a first surface of the first die and a second surface of the semiconductor pillar without exposing the second die, wherein the first die has a greater vertical height than the second die so that the thinning exposes the first surface but not the second die;
    removing the semiconductor pillar completely to form a through opening; and
    forming a back side conductive layer contacting the first die and within the through opening, wherein the second die is separated from the back side conductive layer by a first portion of the encapsulant.

15. The method of claim 14, wherein the removing of the semiconductor pillar comprises performing a selective etch process to remove the semiconductor pillar and a portion of the first die from the first surface of the first die but without etching the encapsulant.

16. The method of claim 14, wherein the semiconductor pillar is a mono-crystalline silicon material.

17. The method of claim 14, further comprising forming a front side redistribution layer over the top surface.

18. The method of claim 14, wherein the semiconductor pillar is placed between the first die and the second die.

19. The method of claim 14, wherein the first die comprises a vertical device, and wherein the second die comprises an integrated circuit chip.

20. The method of claim 19, wherein the second die has no contacts on a back surface of the second die.

21. The method of claim 14, wherein the first die comprises an integrated circuit chip having backside contacts, and wherein the second die comprises an integrated circuit chip having no contacts on a back surface.

22. The method of claim 14, further comprising:
placing a passive device over the carrier before covering the first and the second dies with the encapsulant.

23. The method of claim 22, wherein the passive device has a vertical height smaller than a vertical height of the first die such that a bottom surface of the passive device remain covered by a second portion of the encapsulant after the thinning of the encapsulant.

24. The method of claim 22, wherein the passive device has a vertical height greater than a vertical height of the second die such that a bottom surface of the passive device is exposed after the thinning of the encapsulant, wherein forming the back side conductive layer further comprises contacting the bottom surface of the passive device.

25. The method of claim 22, wherein the semiconductor pillar is placed between the passive device and the first die.

26. A method of forming a semiconductor package, the method comprising:
applying an encapsulation material over a first die, a second die, and a pillar to form a encapsulant having a top surface and an opposite bottom surface;
thinning the encapsulant from the bottom surface to expose a first surface of the first die without exposing the second die;
using an etch process, removing the pillar completely to form a through opening; and
forming a conductive layer contacting the first die, wherein the second die is separated from the conductive layer by a first portion of the encapsulant.

27. The method of claim 26, further comprising filling the through opening to form a through via.

28. The method of claim 26, wherein the pillar comprises a semiconductor material.

29. The method of claim 26, wherein a thickness of the encapsulant before the thinning is at least 500 μm, and wherein the thickness of the encapsulant after the thinning is about 10 μm to about 200 μm.

30. The method of claim 26, further comprising forming a front side redistribution layer over the top surface.

31. A method of forming a semiconductor package, the method comprising:
applying an encapsulation material over a first die, a second die, and a pillar to form a encapsulant having a top surface and an opposite bottom surface;
thinning the encapsulant from the bottom surface to expose a first surface of the first die without exposing the second die;
removing the pillar using an etch process, wherein the etch process also thins the first die to expose a second surface of the first die; and
forming a conductive layer contacting the first die, wherein the second die is separated from the conductive layer by a first portion of the encapsulant.

32. A method of forming a semiconductor package, the method comprising:
applying an encapsulation material over a first die, a second die, and a passive device to form a encapsulant having a top surface and an opposite bottom surface;
thinning the encapsulant from the bottom surface to expose a first surface of the first die and a bottom surface of the passive device without exposing the second die; and
forming a back side conductive layer contacting the first die and contacting the bottom surface of the passive device, wherein the second die is separated from the back side conductive layer by a first portion of the encapsulant.

33. The method of claim 32, further comprising:
applying the encapsulating material over a semiconductor pillar disposed between the first die and the second die; and
removing the semiconductor pillar after thinning the encapsulant to form a through opening, wherein a portion of the back side conductive layer is formed within the through opening.

34. The method of claim 33, wherein the semiconductor pillar is placed between the passive device and the first die.

35. A method of forming a semiconductor package, the method comprising:
applying an encapsulation material over a die and a pillar to form a encapsulant having a top surface and an opposite bottom surface;
thinning the encapsulant from the bottom surface to expose a first surface of the pillar without exposing the die;
using an etch process, removing the pillar completely to form a through opening; and
forming a conductive layer over the bottom surface of the encapsulant and lining the through opening, wherein the die is separated from the conductive layer by a portion of the encapsulant.

* * * * *